United States Patent
Barak et al.

(10) Patent No.: US 11,639,901 B2
(45) Date of Patent: May 2, 2023

(54) TEST STRUCTURE DESIGN FOR METROLOGY MEASUREMENTS IN PATTERNED SAMPLES

(71) Applicant: NOVA LTD, Rehovot (IL)

(72) Inventors: Gilad Barak, Rehovot (IL); Oded Cohen, Gedera (IL); Igor Turovets, Moshav Giv'at Ye'arim (IL)

(73) Assignee: NOVA LTD, Rehovot (IL)

( * ) Notice: Subject to any disclaimer, the term of this patent is extended or adjusted under 35 U.S.C. 154(b) by 17 days.

(21) Appl. No.: 17/498,013

(22) Filed: Oct. 11, 2021

(65) Prior Publication Data

US 2022/0099596 A1 Mar. 31, 2022

Related U.S. Application Data

(60) Continuation of application No. 16/558,212, filed on Sep. 2, 2019, now Pat. No. 11,143,601, which is a
(Continued)

(51) Int. Cl.
| | |
|---|---|
| *G01N 21/956* | (2006.01) |
| *H01L 21/66* | (2006.01) |
| *G03F 7/20* | (2006.01) |
| *G01N 21/88* | (2006.01) |
| *G01N 21/95* | (2006.01) |

(52) U.S. Cl.
CPC ............. *G01N 21/95607* (2013.01); *G01N 21/8806* (2013.01); *G01N 21/9501* (2013.01); *G01N 21/956* (2013.01); *G03F 7/70616* (2013.01); *H01L 22/30* (2013.01);
(Continued)

(58) Field of Classification Search
CPC ............. G03F 7/70616; G03F 7/70625; G03F 7/70633; G03F 7/70641; G03F 7/7065; G03F 7/70683; G03F 9/7003; G03F 9/7007; G03F 9/7046; G03F 9/7073; G03F 9/7076; G03F 9/708; H01L 22/00; H01L 22/10; H01L 22/12; H01L 22/30; G01N 21/8806; G01N 21/9501; G01N 21/956; G01N 21/95607; G01N 2021/8848; G01B 2210/56
See application file for complete search history.

(56) References Cited

U.S. PATENT DOCUMENTS

| | | | | |
|---|---|---|---|---|
| 6,767,680 B2 * | 7/2004 | Schulz | ............... | G03F 7/70625 430/30 |
| 6,856,408 B2 * | 2/2005 | Raymond | ........... | G03F 7/70625 356/636 |
| 7,180,593 B2 * | 2/2007 | Lin | ...................... | G01B 11/272 430/22 |
| 7,282,422 B2 * | 10/2007 | Baek | ................... | G03F 7/70633 257/E23.179 |

(Continued)

*Primary Examiner* — Gordon J Stock, Jr.
(74) *Attorney, Agent, or Firm* — Daniel J. Swirsky; AlphaPatent Associates Ltd.

(57) ABSTRACT

A test structure for use in metrology measurements of a sample pattern formed by periodicity of unit cells, each formed of pattern features arranged in a spaced-apart relationship along a pattern axis, the test structure having a test pattern, which is formed by a main pattern which includes main pattern features of one or more of the unit cells and has a symmetry plane, and a predetermined auxiliary pattern including at least two spaced apart auxiliary features located within at least some of those features of the main pattern, parameters of which are to be controlled during metrology measurements.

11 Claims, 6 Drawing Sheets

Related U.S. Application Data division of application No. 15/319,830, filed as application No. PCT/IL2015/050625 on Jun. 18, 2015, now abandoned.

(60) Provisional application No. 62/014,155, filed on Jun. 19, 2014.

(52) U.S. Cl.
CPC ............. *G01B 2210/56* (2013.01); *G01N 2021/8848* (2013.01); *G03F 7/70625* (2013.01); *G03F 7/70633* (2013.01)

(56) References Cited

U.S. PATENT DOCUMENTS

| | | | | |
|---|---|---|---|---|
| 7,911,612 | B2* | 3/2011 | Kiers | G01N 21/4788 |
| | | | | 430/30 |
| 9,482,519 | B2* | 11/2016 | Zhang | H01L 22/12 |
| 9,547,244 | B2* | 1/2017 | Li | G03F 7/70466 |
| 10,002,806 | B2* | 6/2018 | Amir | H01L 22/30 |
| 10,066,936 | B2* | 9/2018 | Turovets | G01N 21/9501 |
| 10,216,098 | B2* | 2/2019 | Cohen | G03F 7/70683 |
| 10,303,835 | B2* | 5/2019 | Amit | G03F 7/0002 |
| 10,359,369 | B2* | 7/2019 | Barak | G01B 11/14 |
| 11,143,601 | B2* | 10/2021 | Barak | G03F 7/70616 |
| 2003/0021467 | A1* | 1/2003 | Adel | G06V 40/171 |
| | | | | 382/145 |
| 2007/0048629 | A1* | 3/2007 | Marokkey | G03F 7/70683 |
| | | | | 430/5 |
| 2014/0036243 | A1* | 2/2014 | Beyer | G03F 1/72 |
| | | | | 355/52 |

* cited by examiner

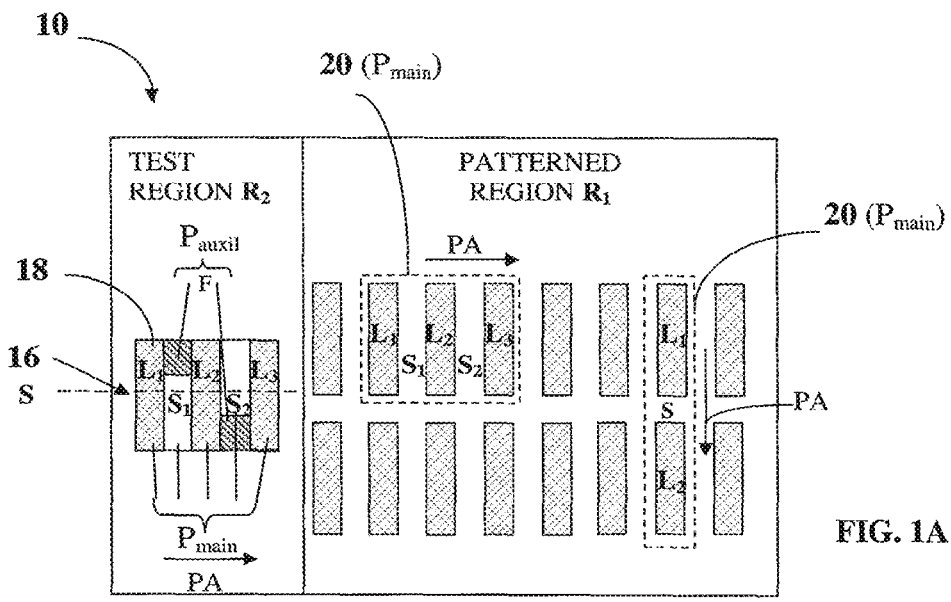
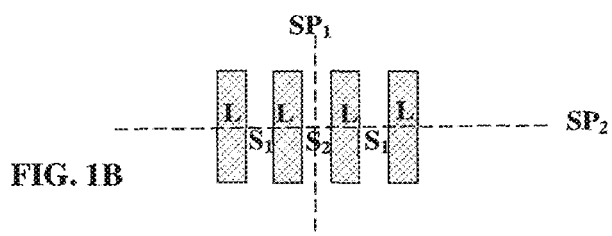
FIG. 1A
FIG. 1B
FIG. 1C
FIG. 1D

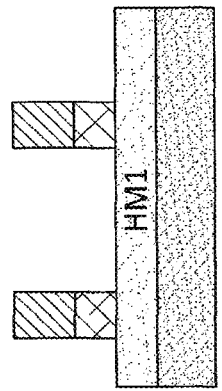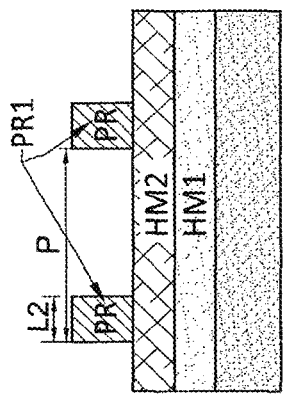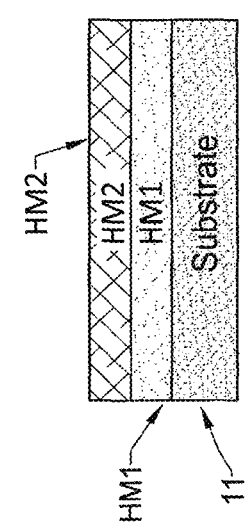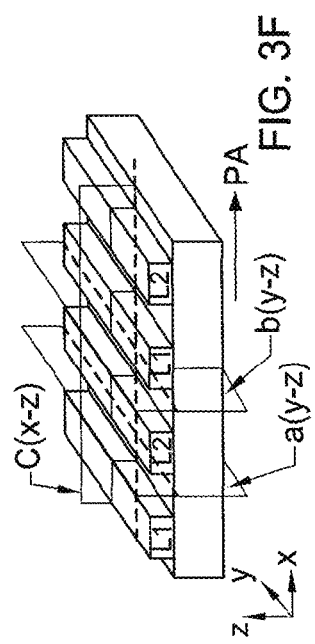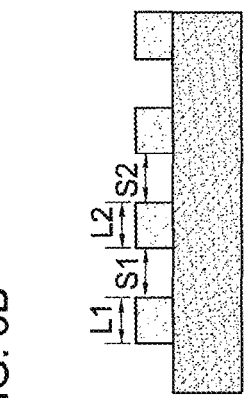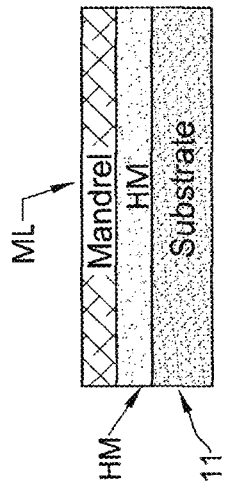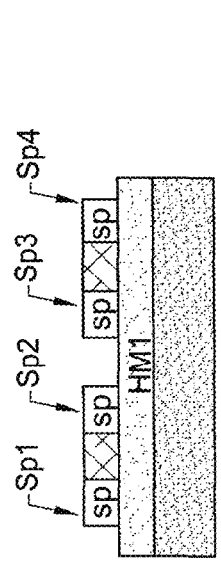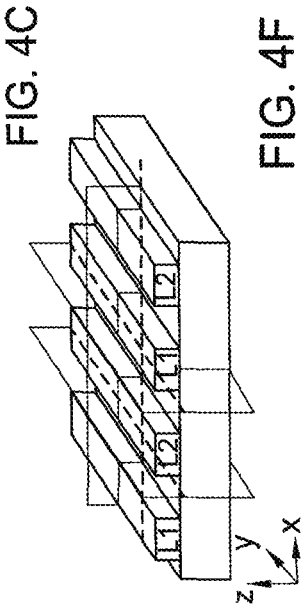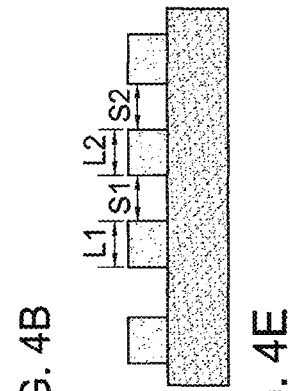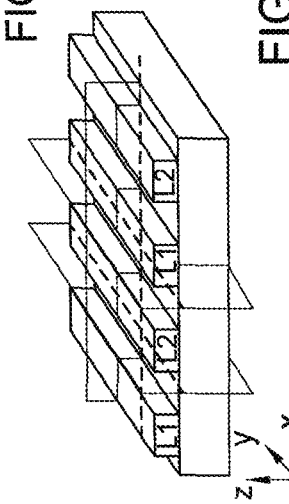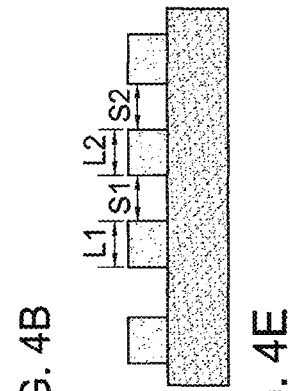

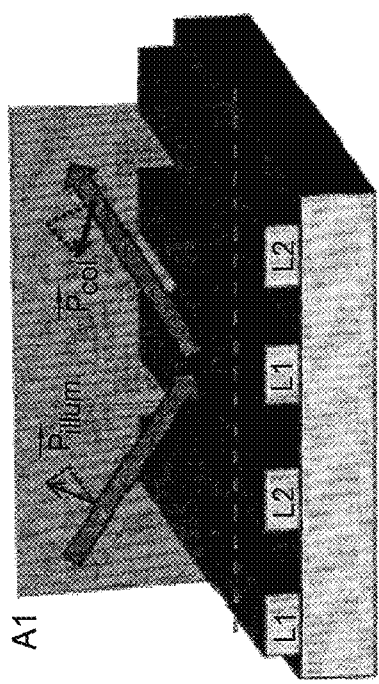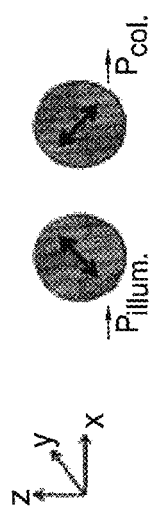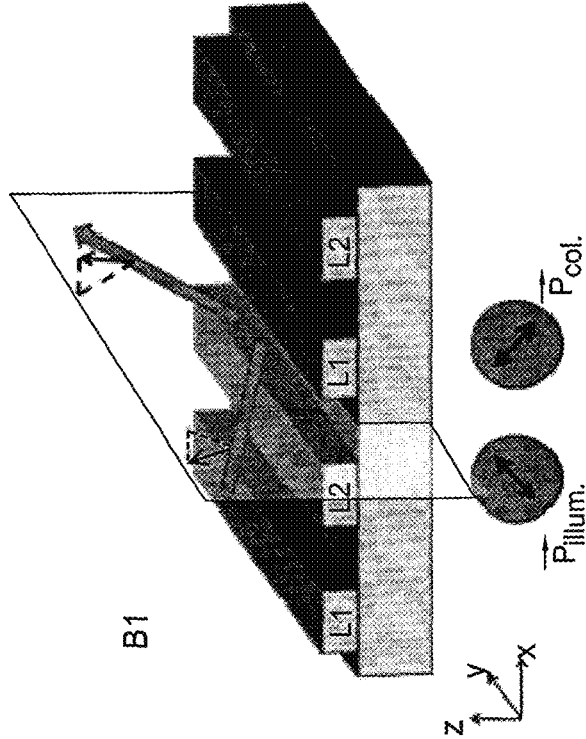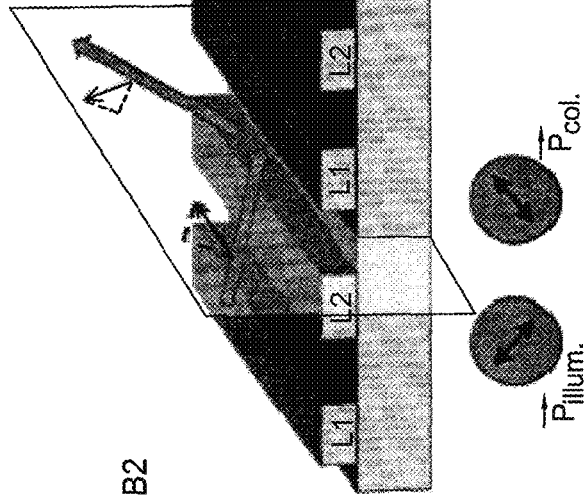
FIG. 5

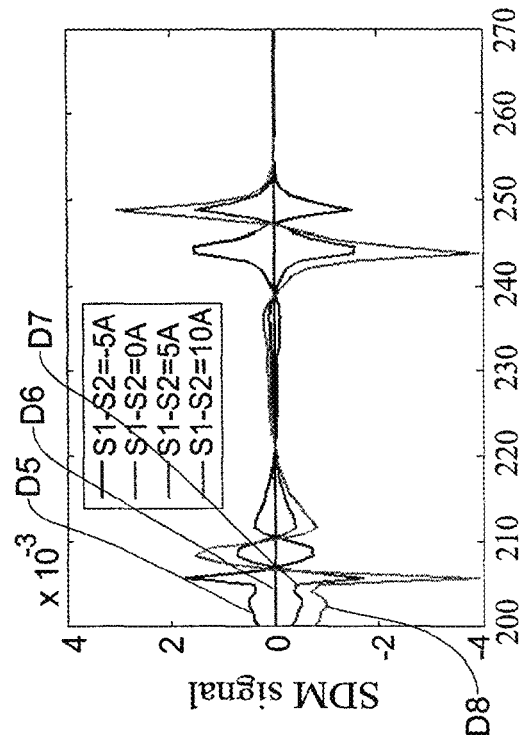
FIG. 8A
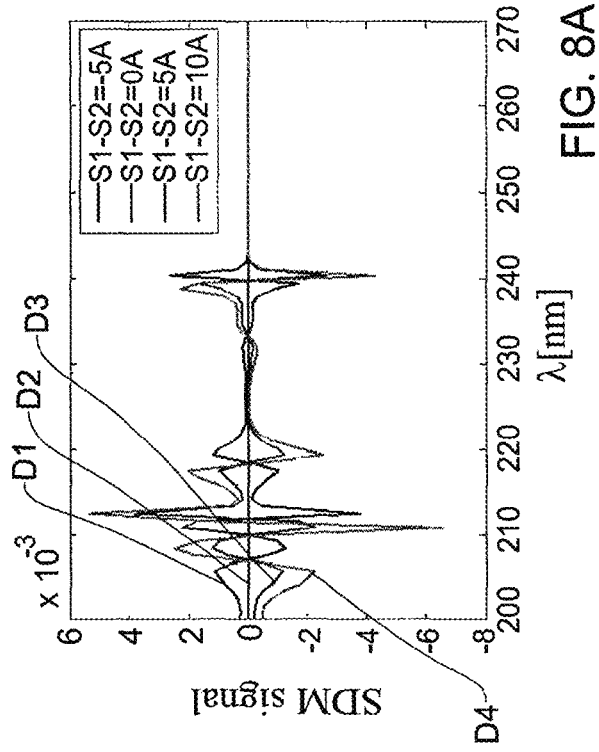
FIG. 8B
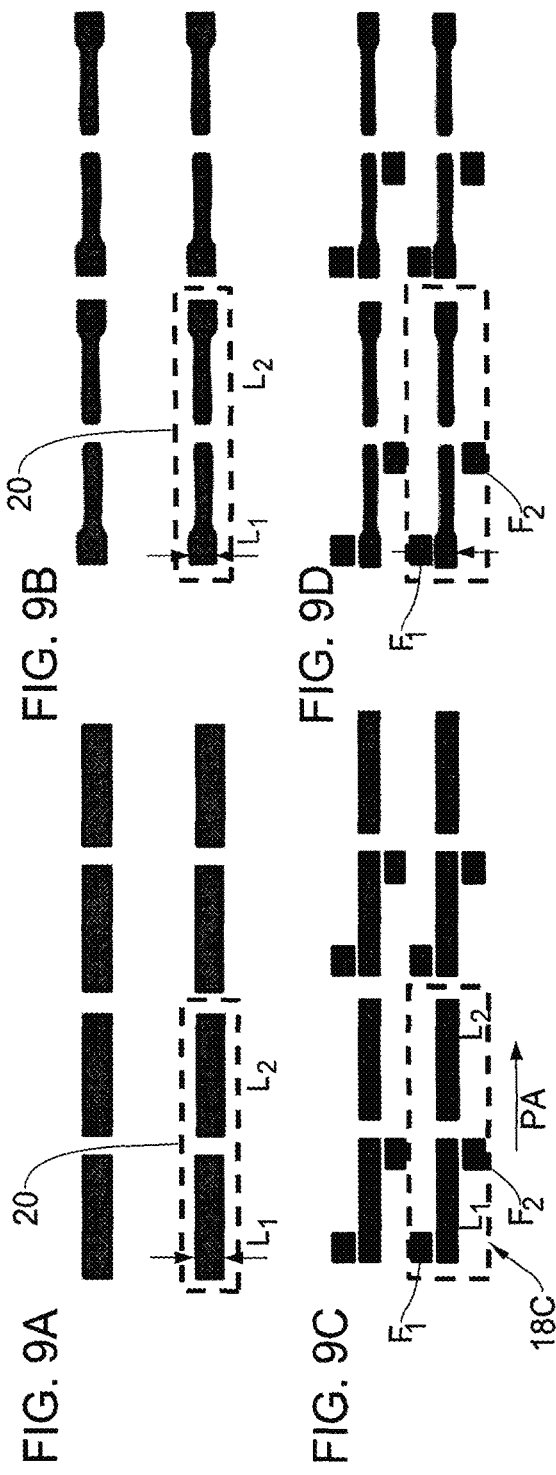
FIG. 9A
FIG. 9B
FIG. 9C
FIG. 9D

TEST STRUCTURE DESIGN FOR METROLOGY MEASUREMENTS IN PATTERNED SAMPLES

TECHNOLOGICAL FIELD AND BACKGROUND

The present invention is generally in the field of optical metrology, and relates to a target design or test structure and measurement method and system utilizing such target for metrology measurements in patterned structures, such as semiconductor wafers. The invention is particularly useful for controlling patterning process during the manufacture of patterned structures.

Microelectronic devices are widely used and are becoming smaller in dimension as well as more complex. Manufacturing of such microelectronic devices requires accurate inspection and metrology to identify appropriate patterns on wafer substrates as well as identify defects in such patterns. Various techniques are known, utilizing optical reflectometry based techniques, for analyzing surface patterns by analyzing properties of light reflected from the sample under inspection. Generally, the structure of a sample can be characterized (obtaining information on the geometry and material properties of the structure) by analyzing the sample's reflectance at different wavelengths, different polarization states and different directions.

Accurate characterization of the geometrical and material properties of microelectronic devices becomes increasingly challenging, as the critical dimensions become ever smaller and the devices become ever more complex. Optical reflectometry is an extremely effective method for obtaining information on the geometry and material properties of such structures. In this method, broadband light is shone on a sample and collected after being reflected from it. By analyzing the reflectance of different wavelengths and in addition polarization components of the incident light, and/or different angles of incidence and/or azimuths, it is possible to obtain information on the structure of the sample. Commonly, optical reflectometry is applied to test structures including a repeating array of identical elements. Conventional metrology methods are used for defining certain parameters of the pattern samples, including geometric parameters and materials characteristics of the pattern.

GENERAL DESCRIPTION

There is a need in the art for optimizing the metrology measurements in a patterned sample.

The present invention takes advantage of the earlier technique described in U.S. Ser. No. 14/265,771, assigned to the assignee of the present application, and incorporated herein by reference. This earlier technique utilizes optical measurements on a patterned sample (real structure) being aimed at identifying asymmetry in the patterned sample, e.g. identifying tilting in periodic gratings (patterns), overlay inaccuracies, etc. More specifically, this technique provides for identification quantification of asymmetry in the pattern features by detecting variations of an optical response of the pattern from that of the symmetry-related response.

The terms "asymmetry" and "symmetry" used herein refer to patterns in a sample, namely to the pattern parameters with respect to a predetermined symmetry plane or point. This may be a surface pattern in a layer of the sample (e.g. uppermost layer), or a pattern formed by a stack of two or more layers, as for example in overlay measurements. Development of asymmetry in a pattern could be an important attribute of the sample manufacturing process which should be properly identified. For example, gratings are typically designed to be mirror-symmetric, while imperfections in the fabrication process may cause them to tilt in one direction and/or cause deviation between the alignment of the two gratings, breaking such symmetry.

The present invention provides a different approach for measurement/controlling pattern parameters in a patterned sample. According to this approach, an auxiliary pattern (surface relief) is added to the sample pattern; the addition of the auxiliary pattern creates a link between the parameter of interest in the sample pattern and some symmetry breaking. The invention enables to use measurement schemes which are sensitive to asymmetry. The technique of the invention can be used for identifying misalignment of patterned layers in a corresponding production structure, like in case of overlay, double- or multi-patterning, SADP, SATP etc.

The invention provides a novel target/test structure design principles, which are configured to provide indication about the manufacture of a real structure. This technique is particularly useful for metrology measurements aimed at process control (control of patterning processes) in the manufacturing of semiconductor wafers. Such test structures are manufactured (patterned) together with the actual devices, e.g. may be located on the margins or scribe lines of a semiconductor wafer, and thus the pattern being formed in the test structure characterizes the patterning process applied to the "real structure" (actual device).

According to the invention, a specifically designed test structure is used which is manufactured and configured (patterned) together with and is thus similar to the real structure but has one or more intentionally induced known features (auxiliary pattern). This creates a link between the pattern parameter(s) of interest in the real structure and some symmetry breaking, enhancing an effect of the parameter deviation in the optical response from the test structure.

As indicated above, metrology methods are used for determining parameters of a sample (geometric parameters and materials characteristics of the pattern in the sample), while the accuracy of measuring these parameters is directly determined by the effect of these parameters on measured spectra. It is hence of great interest to be able to increase the sensitivity of measurements to parameters of interest, possibly at the price of the sensitivity to those parameters which are not of interest for the monitoring process. Those parameters for which small changes in value have a strong effect on the reflected spectra are commonly termed "strong", and can be monitored with great accuracy. Conversely, "weak" parameters are those which have a small effect on the reflected spectra, and their accurate metrology is highly challenging.

The pattern in a real patterned structure (grating, i.e. an array of spaced-apart, e.g. equally spaced, elements/features) typically includes a periodicity of predetermined combination of features (known as "unit cells") extending along a pattern axis.

According to the invention, the test structure has a test pattern including a main pattern (one or more of the unit cells corresponding to that of the sample pattern in the real structure), and also includes an auxiliary pattern created within (on top of) at least a part of the main pattern. It should be understood that the main pattern in the test structure and the sample may be identical to one another, or almost identical, or be in a certain known relation between them. in the description below, for simplicity they are referred to as being similar. The main pattern in the test structure is selected to be formed by one or more of the unit cells. In such main pattern, there always exists at least one plane with respect to which the main pattern is always symmetrical, irrespective of whether the pattern parameters satisfy the design rules or not. Thus, the main pattern is characterized by a "symmetry plane". It should be understood that symmetry condition with respect to this plane is such that there exists a nontrivial manipulation (i.e. different than the unit operation), including mirror-reflections, rotations and possibly lateral shifts, which, when applied to the main pattern, maps to structure onto itself.

The main pattern in the test structure in its simplest case includes at least one pair of first features, whose parameters are to be controlled, spaced by a second feature of the pattern, e.g. two lines/spaces (first features) arranged with a space/line (second feature) between them. Such main pattern is symmetrical with respect to the symmetry plane passing through the center of the lines and spaces and being perpendicular to them (x-z plane), irrespective of whether the widths of the first feature (that are to be controlled) satisfy the design rules or not.

The auxiliary pattern is configured such that the optical response from the test structure (i.e. main pattern and auxiliary pattern) satisfies a condition of symmetry around a selected measurement plane (parallel to the symmetry plane of the main pattern, as will be described below), if and when the CD parameters of the main pattern satisfy the target process goal, and does not satisfy said condition of symmetry around said measurement plane if and when the CD parameters are different from the process goal. Moreover, without the auxiliary pattern, the optical response of the main pattern for selected measurement plane would satisfy a condition of symmetry irrespective of whether the CD parameters of the main pattern are maintained or not.

The auxiliary pattern is in the form of a surface relief formed by features (e.g. grooves, vias) arranged in a spaced-apart relationship and being located within at least some of the features of the main pattern, e.g. at least some of those features of the main pattern the parameters of which are to be controlled. For example, the features of the auxiliary pattern may be located in at least some of the spaces between the lines of the main pattern in case the spaces' parameter(s) is/are to be controlled and/or within at least some of the lines of the main pattern in case the lines' parameter(s) is/are to be controlled.

The features of the auxiliary pattern are located asymmetrically with respect to the characterizing symmetry plane of the main pattern, i.e. the symmetry plane of the main pattern as defined above, i.e. with respect to which the main pattern is always symmetrical irrespective of the variation of the main pattern parameters. As indicated above, the configuration of the auxiliary pattern is aimed at providing a condition that the optical response from the test structure (main and auxiliary patterns) is symmetrical with respect to a selected measurement plane (being a selected symmetry plane of the main pattern) if and when the CD parameters for the features of the same type (spaces or lines) of the main pattern satisfy the target process goal, and does not satisfy said condition of symmetry around said measurement plane if and when the CD parameters for the features of the same type are different (i.e. do not satisfy the target process goal). Hence, the configuration of the auxiliary pattern with respect to the main pattern in the test structure is selected in accordance with the characterizing symmetry plane of the main pattern, such that the entire test pattern is asymmetric with respect to said symmetry plane in case the parameter(s) of the main pattern is/are not the same in the similar features of the main pattern.

With respect to optical measurements, the measurement plane is a plane including axes of propagation of both illuminating beam and beam returned (reflected) from the illuminated location, i.e. illumination and collection channels. Such measurement plane is selected to be essentially perpendicular (exactly perpendicular or almost perpendicular) to the test structure' plane/surface and essentially parallel to the symmetry plane of the main pattern.

The test structure may be of either a so-called "single-size" or "multi-size" (e.g. "double-size") configuration. In the "single-size" configuration of the test structure, the main pattern in the test structure includes a single unit cell), and in the "double-size" configuration the main pattern in the test structure includes two unit cells.

For simplicity, the technique of the invention is exemplified herein below with reference to mirror (reflective) symmetry along one or two axes, as well as rotational symmetry. However, it should be understood that the principles of the invention may be utilized for detecting deviations from various other symmetry conditions of the optical response of a patterned sample, as well as a combination of various symmetry conditions, e.g. including mirror (reflective) symmetry.

Thus, according to one broad aspect of the invention, there is provided a test structure for use in metrology measurements of a sample pattern formed by periodicity of unit cells, each formed of pattern features arranged in a spaced-apart relationship along a pattern axis, the test structure comprising a test pattern, which is formed by a main pattern including main pattern features of one or more of the unit cells and is characterized by a symmetry plane, and a predetermined auxiliary pattern including at least two spaced apart auxiliary features located within at least some of the features of the main pattern which are to be controlled.

One or more of such test structures may be located in a test region of a patterned structure. The patterned structure may be a semiconductor wafer progressing on a production line.

As indicated above, the symmetry plane of the main pattern is a plane essentially perpendicular to the patterned surface and satisfying a symmetry condition of the main pattern, such that there exists a nontrivial manipulation (i.e. different than the unit operation), including mirror-reflections, rotations and/or possibly lateral shifts) along the pattern axis which when applied to the main pattern maps the structure onto itself. The main pattern is symmetric with respect to the symmetry plane irrespective of whether parameters of similar features of the main pattern are equal or not. The auxiliary pattern is asymmetric with respect to the symmetry plane of the main pattern.

Preferably, the auxiliary features of the auxiliary pattern are located within the at least some of those features of the main pattern, parameters of which are to be controlled during the metrology measurements.

As indicated above, the auxiliary features of the auxiliary pattern are configured and arranged with respect to the main pattern such that data indicative of optical response from the test structure is indicative of whether the parameters of interest in the main pattern satisfy the target process goal or not. More specifically, the measured data indicative of optical response from the test structure satisfies a condition of symmetry around a measurement plane, which is parallel to the symmetry plane of the main pattern, if and when parameter(s) of the main pattern being controlled is/are maintained within the test structure, and does not satisfy the condition of symmetry around said measurement plane if and when the parameter varies within the test structure. The data indicative of the optical response comprises a relation (e.g. difference) between first and second measured data pieces corresponding to first and second measurements taken at different measurement conditions. The different measurement conditions are preferably characterized by different polarizations of light collected from the structure.

In some embodiments, the test pattern comprises the main pattern comprising at least one unit cell, where the unit cell comprises three lines with two respective spacings between them. The auxiliary pattern is associated with the at least one unit cell and comprises two vias located in and extending across the two spacings, respectively. This enables to control widths of the spacings by optical measurements using a measurement plane parallel to the symmetry plane of the main pattern which is parallel to the pattern axis. The two vias are preferably located at opposite sides of the line between the two spacings, and at opposite ends of said line.

In some embodiments, the test pattern comprises the main pattern comprising at least one pair of locally adjacent unit cells, where the unit cell comprises two spaced lines. The auxiliary pattern is associated with one unit cell of the pair and comprises two vias located in and extending across the two spacings between the lines, respectively. This enables control of widths of the spacings, by optical measurements using a measurement plane parallel to the symmetry plane of the main pattern which is perpendicular to the pattern axis.

According to another broad aspect of the invention, there is provided a system for use in metrology measurements of a sample having a main pattern characterized by symmetry planes. The system comprises: an optical unit defining an illumination channel for illuminating a test region in a sample with an illuminating beam and a collection channel for detecting collected light reflected from the test region, and a control unit for receiving and processing measured data indicative of detected light. The optical unit is configured and operable such that the illumination and collection channels are located in a plane perpendicular to a sample plane and parallel to the symmetry plane of the main pattern. The optical unit comprises a polarization unit comprising at least one polarization filter located in the collection channel and configured and operable to collect and allow detection of light of a polarization state different from polarization of the illuminating light. The optical unit is operable to perform at least one measurement session, each measurement session including first and second measurements with different polarizations of the detected light each being different to polarization of the illuminating light, and generating first and second measured data pieces respectively. The control unit is configured and operable to process the first and second measured data pieces, and determine a relation between them being indicative of a condition of symmetry of the main pattern in the test region.

According to yet another broad aspect of the invention, it provides a method for use in metrology measurements of patterned samples. The method comprises: associating the patterned sample being measured with a corresponding test structure configured as described above; and performing at least one measurement session on the test structure using a measurement plane parallel to the symmetry plane of the main pattern in the test structure. The measurement session comprises at least first and second measurements, each directing illuminating light onto said test structure along an illumination channel and collecting light reflected from said test structure propagating along a collection channel to be detected, such that detected light has a polarization state different from polarization of the illuminating light, and generating a measured data piece indicative of the light detected in the measurement. Such first and second measured data pieces are processed to determine a relation between them, being indicative of parameters of the main features in the main pattern.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 1A to 1D schematically illustrate the principles of the invention, where FIG. 1A shows a sample formed with a test region, in which the test structure of the invention is located; FIG. 1B illustrates the principles of characterizing symmetry planes in a sample pattern; and FIGS. 1C and 1D show two examples of the configuration of the test structure;

FIGS. 3A-3F schematically illustrate the principles of the Litho-Etch-Litho-Etch (LELE) technique exemplifying a pitch division method;

FIGS. 4A-4F schematically illustrate the principles of the Spacer Assisted Double Patterning (SADP) technique as another example of the pitch division method;

FIG. 5 illustrates schematically two examples of optical measurement schemes using polarized light suitable to be implemented by the measurement system of FIG. 2;

FIGS. 8A and 8B illustrate the results of simulations performed by the inventors for spectral measurements in the test structure using the two measurement schemes respectively of FIG. 5; and FIGS. 9A-9D show schematically yet another example of a test pattern configured according to the invention, where FIGS. 9A and 9B show the main pattern according to the design rules (ideal/desired pattern) and the main pattern with errors as resulted from the patterning process; and FIGS. 9C and 9D show the test structure resulting from the ideal and defective patterning respectively.

DETAILED DESCRIPTION OF EMBODIMENTS

Figure 2:
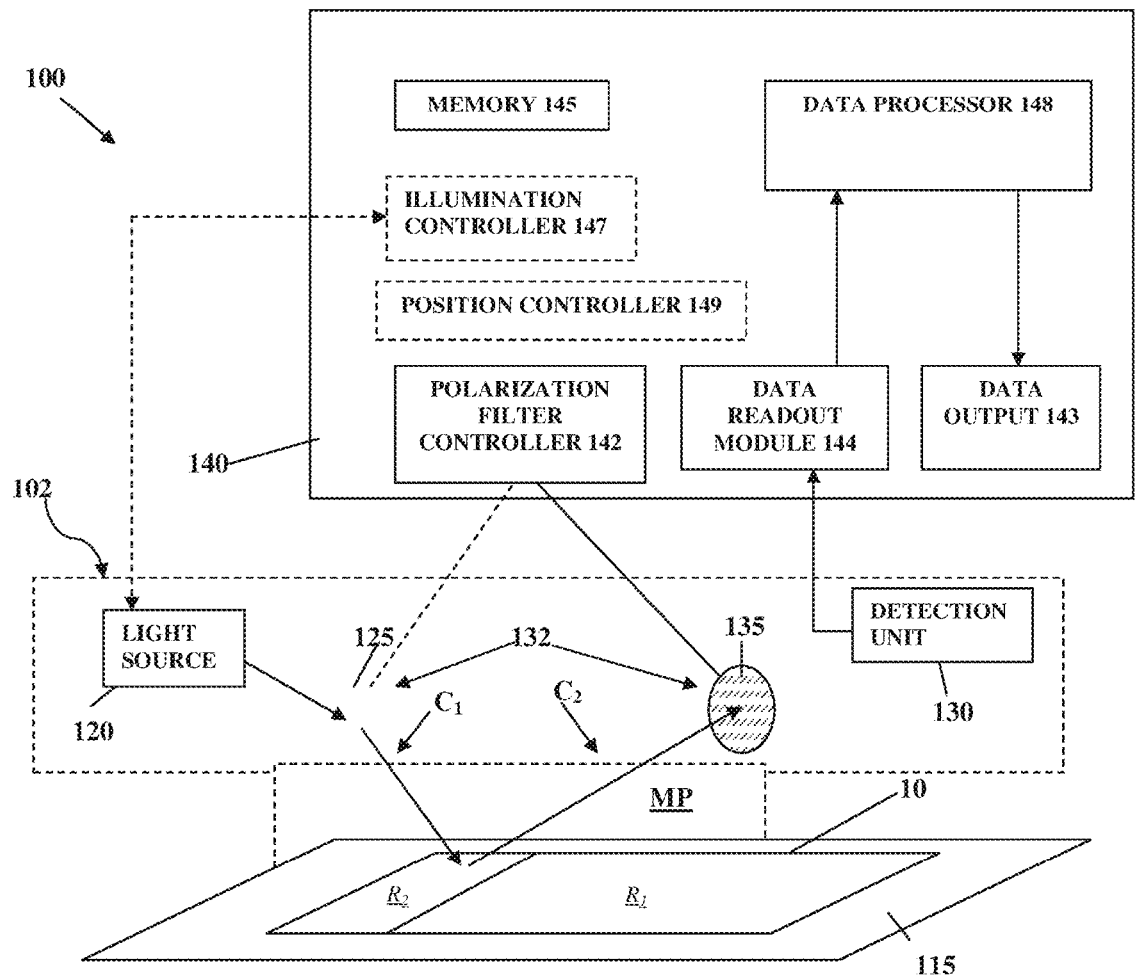
FIG. 2 is a block diagram of a measurement system of the invention for measuring in the test structure configured according to the invention.

The present invention, in its one aspect, provides a specifically designed test structure for simple and robust characterization of a patterned sample for the purposes of controlling the patterning process. This is achieved by configuring the test structure such that it induces a certain asymmetry of the features in the test pattern such as to enhance sensitivity of optical measurements a change in the pattern parameter of interest.

Reference is made to FIGS. 1A-1D schematically illustrating the principles of the invention. FIG. 1A shows schematically a patterned structure (sample) 10 which has a patterned region $R_1$ (constituting a real patterned structure) in which a real pattern or sample pattern 12 is formed, and a test region $R_2$ in which a test structure 16 is located. It should be understood that the figures are not in scale in order to facilitate illustration and explanation, and the figures actually show a small fraction of the pattern sample as well as a small fraction of the test region. The pattern 12 in the real patterned structure $R_1$ is a grating typically including a periodicity of predetermined unit cells 20, each typically including at least two first features (lines or spaces) spaced-apart from one another by second features (spaces/lines) along a pattern axis PA. These may be for example two spaces $S_1$ formed by three spaced-apart lines $L_1$, $L_2$ and $L_3$, or two lines with a space between them.

The test structure 16 has a test pattern 18 formed by features (lines and spaces) of a main pattern $P_{main}$ arranged in a spaced-apart relationship along the pattern axis PA and features F of a predetermined auxiliary pattern $P_{auxil}$. The main pattern $P_{main}$ includes one or more of the unit cells 20, and the auxiliary pattern $P_{auxil}$ is associated with at least some of the features of the main pattern. Preferably, the features F of the auxiliary pattern $P_{auxil}$ are located at least in two or more of those features of the main pattern which are to be controlled, in a predetermined orientation with respect to the main pattern $P_{main}$ as will be described more specifically further below. Thus, for example, if the main pattern is in the form of lines and spaces, and the width of spaces is to be controlled while the line width is considered to be fixed, than the auxiliary pattern $P_{auxil}$ includes at least two features F located in at least two spaces of the main pattern $P_{main}$.

It should be understood that the test region $R_2$ undergoes the same patterning process as the patterned region $R_1$ of the sample 10, and accordingly the arrangement of features of the main pattern $P_{main}$ in the test structure is the same as in the patterned region $R_1$, while the auxiliary pattern $P_{auxil}$ is being intentionally created only in the test region $R_2$ to thereby form the test structure 16.

It should be understood that the main pattern, i.e. one or more of the unit cells formed by spaced-apart features (grating) is always characterized by at least one plane with respect to which the main pattern is always symmetric, irrespective of the pattern parameters of the main pattern. In this connection, reference is made to FIG. 1B showing a pattern in the form of lines L of a certain fixed width (considered constant) which are arranged with spaces between them, the width of which is to be controlled. As shown in the figure, such pattern is characterized by two symmetry planes $SP_1$ and $SP_2$, each being such that the pattern remain symmetric with respect to this plane, irrespective of whether $S_1=S_2$ or not. The characterizing symmetry plane $SP_1$, $SP_2$ typically passes through the center of the feature. Considering elongated features of the pattern (lines) and the symmetry plane parallel to the elongated features, such characterizing symmetry plane $SP_1$ typically passes through the center of the space, i.e. feature the parameter of which is being controlled. As shown in the figures and will be described more specifically further below, the auxiliary pattern $P_{auxil}$ is configured such that the features F thereof are asymmetrically oriented with respect to the characterizing symmetry plane $SP_1$, $SP_2$ of the main pattern $P_{main}$.

The optical measurement system is configured and operable to define a measurement plane oriented parallel to the selected characterizing symmetry plane $SP_1$ or $SP_2$ of the main pattern $P_{main}$ and create different measurement conditions, such that measured optical response from the test pattern 18 is indicative of a condition of pattern parameters of the main pattern (i.e. of the sample pattern 12).

As more specifically illustrated in FIGS. 1C and 1D, the test patterns 18A and 18B may be of a single-size (FIG. 1B) or double-size design (FIG. 1C). In the single-size design of FIG. 1C, the characterizing symmetry plane is considered for the main pattern including one unit cell, and the features F of the auxiliary pattern are located asymmetrically with respect to this plane. In this specific example, features F of the auxiliary pattern are located are located in all the features of the main pattern $P_{main}$ that are to be controlled. In the double-size design of FIG. 1D, the characterizing symmetry plane is considered for the main pattern including two unit cells, and the features F of the auxiliary pattern are located asymmetrically with respect to this plane. In this example, the features F of the auxiliary pattern are located in the features of the main pattern $P_{main}$ that are to be controlled within one unit cell only.

As indicated above and will be described more specifically further below, the symmetry or asymmetry of the optical response of the test pattern is considered with respect to the selected measurement plane which is perpendicular to the test structure, includes illumination and collection channels, and is parallel to the symmetry plane of the main pattern.

Reference is made to FIG. 2 illustrating schematically, by way of a block diagram, a measurement system 100 of the invention configured and operable for measuring on the test structure and identifying asymmetry/symmetry condition of the test pattern, and preferably also determining a level of asymmetry. The measurement system 100 includes an optical unit 102 accommodated with respect to a sample holder 115, and connectable (via wires or wireless signal transmission) with a control unit 140.

The optical unit 102 defines an illumination channel $C_1$ and a collection channel $C_2$, and includes a light source unit 120 configured to illuminate, through the illumination channel $C_1$, the test region $R_2$ in which the test structure 16 is located; and a detection unit 130 configured to receive light returned (reflected) from the sample and propagating along the collection channel $C_2$. Further preferably provided in the optical unit 102 is a polarization unit 132 associated with at least the collection channel $C_2$, i.e. includes one or more polarizer filters located at least in the collection channel 13.

The optical unit 102 is preferably configured (i.e. its elements are accommodated with respect to the sample holder and with respect to one another) to orient the illumination and collection channels $C_1$ and $C_2$ such that the collection channel collects light including specular reflection from the sample 10. Additionally, the optical unit 102 may be configured to orient the illumination and collection channels with an oblique light propagation arrangement with respect to the sample plane such that s and p polarization states can be well defined.

The polarization unit 132 includes at least one polarization filter 135, located in the collection channel $C_2$ which may provide a linear or circular polarization. In this connection, a circular polarization filter is an optical assembly configured to allow transmission of either clockwise or counterclockwise polarization component of light. Such circular polarization filter may include a linear polarizer and a quarter-wave plate, and may be oriented such that only clockwise (or counterclockwise) polarization component pass through the polarizer assembly.

The control unit 140 may include a polarization controller 149 connectable to the polarization filter 135 (generally, to the polarization unit 132) and configured to controllably vary the orientation of its preferred plane of polarization between different polarization states (at least a first polarization state and a second polarization state).

Additionally, in some embodiments, the polarization unit 132 also includes one or more polarization filters 125 located in the illumination channel $C_1$. The illumination-channel polarization filter 125 may be generally similar to the collection-channel polarization filter 135 but differing in the orientation of its preferred plane of polarization and thus differing in the polarization component it transmits. The control unit 140 (its polarization controller 149) may also be connectable to the polarization filter 125 and configured to cause the polarization filter 125 to rotate or shift between at least first and second orientations, thereby transmitting light of a first or second polarization state.

The control unit 140 is typically an electronic device including inter alia such software/hardware utilities/modules as data input (or data readout) and output 144 and 143, memory 145, and data processor 148, and may also include a polarization filter controller 142, as well as an illumination controller 147 and a position controller 149. The control unit 140 is configured to receive and process measured data provided by the detection unit 130 as will be described further below, and may be configured to operate the optical unit (e.g. its polarization unit 132 and possibly also the light source unit 120). The illumination controller 147 may be configured to operate the light source unit 120 to provide illumination of a selected type (wavelengths, illumination pattern, and/or operation mode, i.e. CW or pulse mode). The position controller 149 may be configured for controlling a relative accommodation between the sample holder 115 and at least some elements of the optical unit 102, e.g. for providing measurements on preset or desired locations on the sample, as well as providing a desired orientation of a measurement plane MP. The measurement plane MP is typically oriented such that it is perpendicular to the sample holder (and thus to the sample's surface) and includes the illumination and collection channels $C_1$ and $C_2$, as will be described further below.

For example, the control unit 140 may operate the light source unit 120 to sequentially illuminate the sample 10 with predetermined first and second different polarization states of light, or unpolarized and polarized light. The polarization filter controller 142 may accordingly operate the collection-channel polarizer 135 and possibly also the illumination-channel polarizer 125 to allow sequential detection of predetermined polarization components of reflected light, and generate first and second measured data indicative thereof (i.e. indicative of intensity of the corresponding polarization component in the detected light).

The control unit 140 operates the optical unit 102 to perform at least one measurement session including at least first and second measurements with different measurement conditions. The different measurement conditions may include different polarization states of the detected light, both being different from the polarization state of the illumination. These may include unpolarized illumination in the first and second measurements and different linear polarization of detected light; or preferably $P_1$ and $P_2$ polarizations of the illumination and $P_2$ and $P_1$ polarizations of detection respectively. Generally, two or more measurements are applied in the measurement session, with one or more orientations of the polarizer filter 135 in the collection channel and possibly also the polarizer 125 in the illumination channel. This can be achieved by appropriately operating (switching) the polarization filters in the illumination and detection channels. For example, the illumination channel may be operated to sequentially provide illumination of the same region with two or more different polarization states of incident light, while the collection channel is operated to sequentially collect one or more different polarization components of the reflected light, selected in accordance with the polarization state of the incident light. Thus, the output of the detection unit in the measurement session includes first and second measured data pieces $MD_1$ and $MD_2$ (e.g. sequentially obtained).

The data processor utility 148 (software utility) of the control unit 140 is adapted (preprogrammed) to analyze first and second measured data pieces $MD_1$ and $MD_2$, and determine and analyze a relation (e.g. difference) between the measured data pieces (which is indicative of symmetry/asymmetry condition in the pattern being measured), and generate data indicative of a condition of pattern parameters in the sample pattern. The relation between the first and second measured data pieces $MD_1$ and $MD_2$ may also be indicative of a level of asymmetry.

The invention provides a measurement scheme which is preferably based on spectral reflectometry, where the light response of the sample over a broad spectral range is measured. The configuration of the test structure is aimed at enhancing the asymmetry information of the sample.

Reference is made to FIGS. 3 and 4 schematically exemplifying variation of pattern parameters (asymmetry of pattern) in patterned samples, which might occur during the manufacturing (patterning) process. It should be noted that the following are only examples of patterned structures which can benefit from the technique of the invention in identifying manufacture deviations/asymmetries. These examples, fabricated by pitch division methods, are by no means inclusive and the invention is not limited to them.

Pitch division, implemented through multiple patterning, is today the key method to achieve small-pitch structures, and consequently plays a key role in all advanced semiconductor device fabrication. These methods introduce a set of challenges to the fabrication process. The fabrication of dense structure using pitch division may be realized through several process flow schemes. Each of those schemes has possible intrinsic division error mechanisms as described below. Here, the most commonly used fabrication flows are presented, but extending the proposed metrology approach to other fabrication flows is straightforward.

The first pitch division method, described in FIGS. 3A-3F, is called Litho-Etch-Litho-Etch (LELE). In order to achieve ½ pitch (½P) of the lithography printing pitch capability, the following sequence is typically used. As shown in FIG. 3A, two hard-mask layers, a first layer $HM_1$ and a second layer $HM_2$, are deposited on a substrate 11 with distinctive etch selectivity. After that, as shown in FIG. 3B, photolithography printing step $PR_1$ is performed for printing of lines with width $L_1$ of ¼P and Space of ¾P between them. In the third step, exemplified in FIG. 3C, selective chemical etching is applied to the pattern through the mask layer $HM_2$, while the mask layer $HM_1$ is intact due to its resilience to the chemistry used for removing parts of the layer $HM_2$. Second photolithography printing $PR_2$ is then performed being intended to create lines with the same width $L_1$ as the first printing, but with their centers offset by ½P with respect to the first lines center, as shown in FIG. 3D. A second selective etch step is performed, as shown in FIG. 3E, resulting in the main pattern $P_{main}$ formed by alternating lines L of HM1 and grooves/spaces S between them. As appreciated, the LELE pitch division scheme may be generalized to three pitch division or more by adding photolithography and etch cycles.

Two main error types can occur during the LELE process: First, photolithography print-to-print tool instability, such as exposure dose or focus, may cause a difference between the critical dimensions (CD), widths, of alternating lines (i.e., $L_1 \neq L_7$, FIG. 3E). In addition, any overlay error between the two lithography steps will introduce an offset between alternating grooves (i.e., $S_1 \neq S_2$, FIG. 3E). The invention provides for identifying these errors in high accuracy, as will be detailed below.

The second pitch division method, described in FIGS. 4A-4F, is called Spacer Assisted Double Patterning (SADP). Similarly to LELE, this scheme achieves a grating with half the lithography pitch, ½P, and involves the following steps. The first step, shown in FIG. 4A, involves deposition of two layers, a hard-mask layer HM, and a mandrel layer ML on top of a substrate 11. In the second step, photolithography printing step PR is performed for printing of mandrel lines with the pattern pitch P and width $L_1$ equal to the width of intended groove/space S, as shown in FIG. 4B. Photo-resist removal is followed by deposition of thin film spacers, such that spacer blanket etch forms two pillars, $Sp_{1-2}$ and $Sp_{3-4}$, on the sides of each line etched in the mandrel layer ML, as shown in FIG. 4C. The mandrel layer/pattern ML is then removed, as shown in FIG. 3D, and the spacers $Sp_{1-4}$ and the HM layer are resilient to the etch chemistry used in this step. In the following step, the HM layer is etched. As a result, the main pattern $P_{main}$ is formed including lines L of HM layer and spaces S between them (at the places of the removed mandrel lines and in the gap(s) between the spacer pillars), as FIG. 4E shows. Again, the SADP scheme may be generalized to three pitch division (Spacer Assisted Triple patterning) and more by having multiple spacer deposition and blanket etch and removal cycles with appropriate removal etching chemistry. Yet another generalization scheme is to use the spacer pillar as the mandrel of the next cycle—yielding Quadruple and 8 fold patterning.

Contrary to LELE, in SADP the CDs (widths) of the lines are usually matched (i.e., L1=L2, FIG. 4E). However, as soon as the mandrel width equals the gap between adjacent spacers, the space S width will fluctuate around the intended relation S1=S2. Such deviation can arise from mandrel photolithography step instability (such as exposure energy, focusing) and mandrel etch bias fluctuations.

As shown in FIGS. 3F and 4F, the printed grating satisfies mirror symmetries with respect to three planes a, b and c, where plane c is a x-z plane and passing through a center of the pattern features, and planes a and b are y-z planes passing through the centers of different lines respectively. Thus, the printed grating satisfies mirror symmetries regardless of whether the widths of the grating lines and/or of the spaces between them (i.e. CDs of the pattern) are perfectly maintained along the pattern axis or not. Indeed, considering, for example, that L1≠L2 in FIG. 3F, applying mirror symmetry to the plane marked 'a', maps the L1 lines onto identical L1 lines, and L2 lines onto identical L2 lines. The fact that applying mirror symmetry with respect to this plane maps the structure onto itself implies it is mirror-symmetric with respect to a characterizing symmetry plane.

In this connection, reference is made to FIG. 5 illustrating schematically some optical measurement schemes, A1-A2, B1-B2 using polarized light, which may be implemented by the optical unit 102 of FIG. 2 above. Here, the measurement scheme A1-A2 corresponds to a measurement session including first and second measurements A1 and A2, and the measurement scheme B1-B2 corresponds to a measurement session including first and second measurements B1 and B2. The measurements are applied to the sample pattern (region $R_1$ in FIG. 1A) which is exemplified here in the form of two unit cells each including two spaced-apart grating lines $L_1$ and $L_2$. The measurements are aimed at identifying whether the width of the lines is maintained or not, i.e. whether L1=L2 or L1≠L2.

Basically, in both schemes, in the first measurement A1, B1, the illumination path $C_1$ is configured to provide light polarized in a first direction —$P_1$ polarization state (designated $P_{illum}$ in the figure), and the detection path $C_2$ is configured to provide collection of light of a second polarization direction/state $P_2$ ($P_{col}$ in the figure); and in the second measurement A2, B2, the illumination light is polarized in the second direction $P_2$, while the collected light is polarized in the first direction $P_1$. In the measurement session/scheme A1-A2, the measurement plane MP, which includes the illumination and detection channels $C_1$ and $C_2$, is similar to plane c of FIGS. 3F and 4F, i.e. x-z plane. If the sample pattern $P_{main}$ being measured is symmetric with respect to the x-z plane, the optical measurements A1 and A2 satisfy the symmetry condition, i.e. the results of the first and second measurements A1 and A2 are the same (at least up to measurement noise), i.e. corresponding measured data pieces $MD_1$ and $MD_2$ are equal ($MD_1-MD_2=0$; or $MD_1/MD_2=1$). Similarly, measurement of a sample pattern possessing mirror symmetry with respect to the y-z plane (planes a and b in FIGS. 3F and 4F), provides equal results for measurements B1 and B2.

However, as described above, the measured sample possesses mirror symmetry, in both cases: L1=L2 or L1≠L2, i.e. the above-mentioned pairs of measurements will give equal results on both such conditions.

Hence, determination of a relation between measured data pieces $MD_1$ and $MD_2$ (e.g. the subtraction of these measurement pairs) would be directly related to the symmetry condition of a sample pattern, i.e. the subtracted spectrum will be strictly zero for symmetric patterns, and any deviation from zero will indicate digression of the measured sample from perfect symmetry, only with addition of an auxiliary pattern which would result in the asymmetric pattern with respect to the characterizing symmetry plane of the main (sample) pattern.

The present invention involves using a test structure which, in addition to the main pattern, includes an auxiliary structure (pattern) to create an inherent link between the parameter of interest of the main pattern and some specific symmetry. When this dedicated auxiliary structure is added to the main pattern, any deviation of the parameter of interest of the main pattern from its nominal value gives rise to an asymmetry, which can then be identified using a dedicated symmetry-sensitive measurement scheme. The strength of this approach is that it allows using symmetry-sensitive (possibly nulling) approaches to characterize parameters of interest which are not necessarily linked to symmetry breaking by themselves.

Turning back to FIGS. 1C and 1D, they illustrate two specific but not limiting examples of the test patterns 18A and 18B. As described above, the main pattern in these structures (without the features F of the auxiliary pattern $P_{auxil}$) is symmetric with respect to characterizing symmetry planes $SP_1$ and planes $SP_2$. However, when the auxiliary patterns are added considering the proper/selected characterizing symmetry planes so as to be asymmetric with respect to the selected plane, the entire test pattern is no longer mirror symmetric if the feature of interest of the main pattern varies. It should be understood that the test structure may include any number of unit cells, and accordingly there is a plurality of such characterizing symmetry planes. Considering the structure of FIG. 1D, where the symmetry planes $SP_1$ are along the pattern features (i.e. perpendicular to the pattern axis), the main (sample) pattern is mirror-symmetric even when L1≠L2, and hence a symmetry-sensitive measurement scheme will not be able to detect such process deviations. However, once the auxiliary structure is added, these symmetry planes $SP_1$ of the main pattern will remain symmetry planes for the entire test pattern only when L1=L2. Then, any symmetry-sensitive metrology method using the measurement plane parallel to the symmetry plane of the main pattern, can directly detect the deviations from L1=L2.

Figure 7:
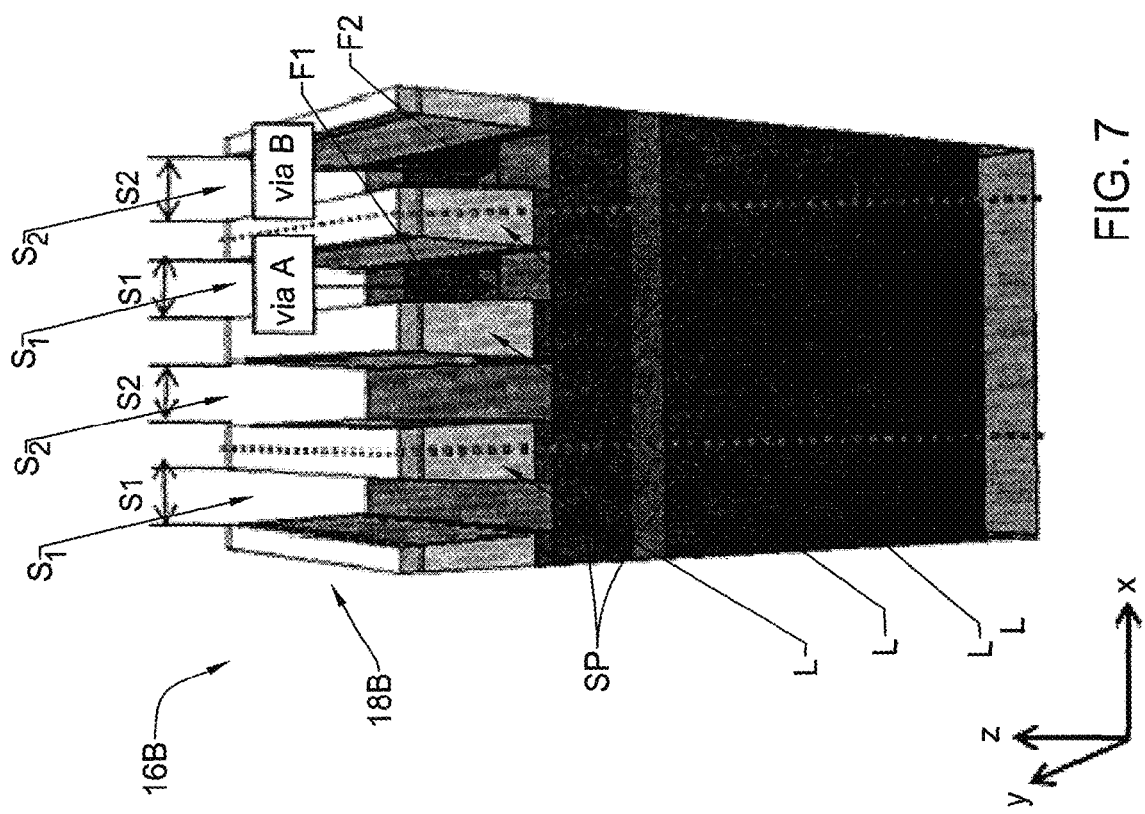
FIGS. 6 and 7 illustrate how the measurement schemes of FIG. 5 can be applied for measuring in the test structures of FIGS. 1C and 1D respectively, suitable for detecting errors in the LELE or SADP process.
Figure 6:
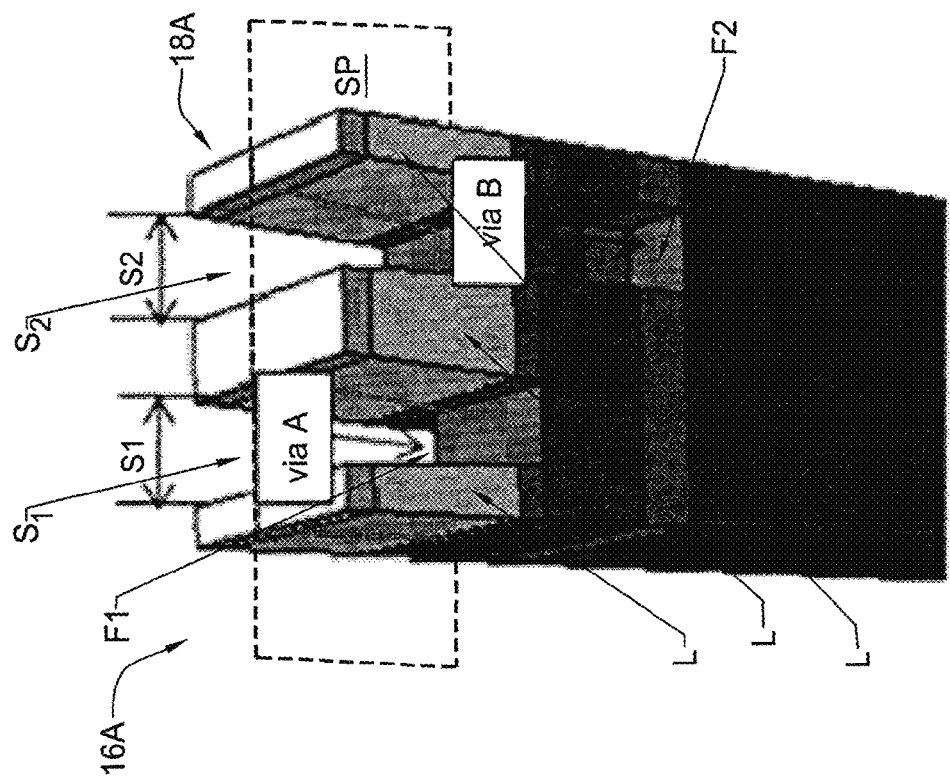

Reference is now made to FIGS. 6 and 7 illustrating the use of the above described measurement schemes A1-A2, B1-B2 (implemented by the system of FIG. 2) for measuring in the test structures 16A and 16B having such test patterns 18A and 18B. This technique can be used to detect errors in a LELE or SADP process.

In FIG. 6, the test structure 16A includes the test pattern 18A formed by the unit cell 20 in a proposed grating design (the grating is comprised of a periodic array of such unit cells). The test pattern 18A includes the main pattern $P_{main}$ and the auxiliary pattern $P_{auxil}$. The main pattern $P_{main}$ includes three lines L of a constant width and alternating spacings $S_1$ and $S_2$ the parameters of which are to be controlled, to determine whether their width satisfy a condition $s_1=s_2$. The auxiliary pattern $P_{auxil}$ is formed by features $F_1$ and $F_2$ (grooves or vias) located (etched) within said spacings $S_1$ and $S_2$ of the main pattern. The present example is aimed at monitoring/controlling the widths s1 and s2 of the spacings $S_1$ and $S_2$, i.e. determining whether s1=s2 or s1≠s2. Accordingly, the features of the auxiliary pattern are located in the spacings. It should be understood that the grooves of the auxiliary pattern extends entirely across the respective spacings, and thus the parameters of the grooves correspond to the widths of the spacings. As shown in the figure, the auxiliary pattern $P_{auxil}$ is asymmetric with respect to the characterizing symmetric plane of the main pattern $P_{main}$.

Considering the above described measurement schemes of FIG. 5, if there is no auxiliary pattern, the above described measurement session, using the measurement plane parallel to the characterizing symmetry plane of the main pattern, provides the same results irrespective of whether s1=s2 or s1≠s2. However, let us now consider the test structure in which the main pattern $P_{auxil}$ and addition of the auxiliary pattern $P_{auxil}$ are used configured as shown in FIG. 6, where the features F1 and F2 of the auxiliary pattern are located in the spaces $S_1$ and $S_2$ the width of which is to be controlled, with asymmetric orientation of features F1 and F2 with respect to the symmetry plane of the main pattern. When the optical measurements described above are applied using the measurement plane being x-z plane, the difference between the two polarization-based measurements $MD_1$ and $MD_2$ would be different for the cases of s1=s2 and s1≠s2. This is because the auxiliary pattern configured as described above affects the polarization of incident light used in the measurement schemes A1 and A2 such that for any s1≠s2 condition, there is a difference between the measured data pieces $MD_1$ and $MD_2$. Thus, by subtracting the two measured data pieces (or generally, determining a relation between them, e.g. ratio), any result showing that the data pieces are not equal indicates that s1≠s2.

It should be noted that the auxiliary pattern (the additional print design of vias in this example) is typically an existing and available layer/photolithography mask, therefore the design does not make the entire process more complex and can comply to the layer's design rules through standard process schemes. For this example, these include Via-first-trench-last or Via-last-trench-first flows.

In FIG. 7, the test structure 16B includes the test pattern 18B of the double-size design (e.g. two unit cells). The test pattern 18A includes the main pattern $P_{main}$ including spaced-apart lines L with alternating spacings (two pairs of spacings $S_1$ and $S_2$ being shown in the figure) whose CDs (widths) are to be controlled; and the auxiliary pattern $P_{auxil}$ formed by features $F_1$ and $F_2$ (grooves or vias) located (etched) within the spacings $S_1$ and $S_2$ of one unit cell of the pair of adjacent unit cells. In this example, the symmetry plane and accordingly the measurement plane MP is y-z plane. In this case, the measured data pieces $MD_1$ and $MD_2$ obtained as described above would be the same whenever s1=s2; however, when s1≠s2, the measured data pieces $MD_1$ and $MD_2$ are different. Thus, with the measurement schemes B1 and B2 of the measurement session described above, and determining a relation between the corresponding measured data pieces (e.g. subtracting the two measurements), any result corresponding to non-equal measured data pieces (e.g. nonzero result) is directly indicative of the s1≠s2 condition (process error).

It should be noted that in the above described non limiting examples the features of the auxiliary pattern (vias) are located within the spacings of the main pattern because the spacings are those pattern features the parameter(s) of which are being controlled. Alternatively or additionally, should the test structure be designed for controlling the line parameters (e.g. in addition to the spacings), the features of the auxiliary pattern are located within at least some of the lines of the main pattern (e.g. in addition to the features in the spacings).

It is important to note that the above presented solutions are only examples to the general approach outlined in this invention. The methodology of intentionally designing the test structure/site to link a specific symmetry property with a parameter of interest can be implemented in many OCD applications. Furthermore, utilizing measurement schemes which outline these symmetries could provide great sensitivity enhancements to these parameters. The designing of the test structure could include analyzing symmetry properties, design and providing a test structure which breaks the symmetry in case of changing parameter(s) of interest and utilizes a measurement method which is sensitive to the symmetry/asymmetry.

Reference is now made to FIGS. 8A and 8B which illustrate results of two simulations performed by the inventors. As mentioned above, the optical measurements are spectral measurements, and accordingly, the signal describing the difference between the first and second measured data pieces is actually in the form of a spectral signature. The simulation results thus present the dependency of the resulting spectral signature on the difference between the pattern parameters s1 and s2. FIG. 8A exemplifies the spectral sensitivity to the difference between s1 and s2 when using the test structure 16A and the measurement schemes A1 and A2, and FIG. 8B exemplifies the spectral sensitivity to the difference between s1 and s2 when using the test structure 16B and the measurement schemes B1 and B2. Specifically, both figures show that when s1=s2, illustrated by curves (spectral signatures) D2 and D6, the difference between the measured data pieces obtained with the test structures 16A and 16B and the measurement schemes A1-A2 and B1-B2, is zero (or generally, the measured data pieces are equal). On the other side, when s1≠s2, for example the difference between the spacings is −5 Å (curved D1, D5), 5 Å (curves D3, D7) or 10 Å (curves D4, D8), the measured data pieces are different, e.g. difference between the spectral signatures obtained using the measurement schemes A1-A2 and B1-B2 is not zero.

Reference is made to FIGS. 9A-9D showing schematically yet another specific but not limiting example of a test pattern 18C that can be used according to the invention in order to enhance and highlight the asymmetry caused in optical measurements if and when a parameter of interest deviates from its nominal value. Moreover, this particular example shows how a different kind of symmetry can be considered for highlighting the parameter of interest, e.g. symmetry with respect to rotation by 180°, along with the appropriate measurement scheme which highlights this symmetry.

FIGS. 9A and 9B show, respectively, the unit cell 20 with the main pattern $P_{main}$ configured according to the design rules (ideal pattern) and the same as resulted from the patterning process. The "ideal" (desired) main pattern $P_{main}$ includes a grating where each unit cell 20 holds two rectangular structures (lines) $L_1$ and $L_2$ arranged with a space between them. Nominally, all rectangles should be identical and equally spaced. One of the expected errors in this sample, as shown in FIG. 9B, is such that printed line pairs may become narrower (or wider) at their center (line width variation along the line).

The selected measurement scheme is aimed at highlighting deviations from 180° rotational symmetry Such measurement scheme could be, for example, measuring the sample at one orientation, rotating it by 180° and measuring again. For such measurement scheme to work, the light illumination and collection channels must differ (e.g. have polarizers with different orientations). Otherwise the two measurements will be equal even for non-180°-symmetric samples by virtue of time reversal symmetry. It should be noted that both the nominal (FIG. 9A) and the badly printed (FIG. 9B) structures satisfy this symmetry. Consequently, the subtraction of two such 180°-symmetric measurements will result in zero signal, regardless of the existence of an error.

One of the possible design changes is by using a test pattern 18C illustrated in FIG. 9C in which the auxiliary pattern adds two markers (features) F to one of the two lines of the main pattern. It should be noted that these markers/features F by themselves preserve rotational symmetry by 180°, for rotation around the center of either of the two rectangles/lines. However, in the presence of a fabrication error (FIG. 9D), the measured data pieces for two different measurement conditions as described above are different, and thus subtraction of the two measurements provides a nonzero signal which is directly related to the printing error.

Thus, the present invention provides a novel approach for monitoring the pattern parameters in patterned structures. The invention provides a novel design of a dedicated test structure, and also provides for appropriate measurements schemes to be used in measuring in such test structure to identify an error/deviation of the pattern parameters.

What is claimed is:

1. A test structure for use in metrology measurements of a sample pattern formed by a periodicity of unit cells, where each of the unit cells is formed of pattern features arranged in a spaced-apart relationship along a pattern axis, the test structure comprising a test pattern formed by a main pattern formed by two or more layers which includes main pattern features and has a symmetry plane, and a predetermined auxiliary pattern including at least two spaced-apart auxiliary features located within at least a part of the main pattern, wherein parameters of the main pattern are to be controlled during metrology measurements, and wherein the auxiliary features of the auxiliary pattern are configured and arranged with respect to the main pattern such that misalignment of said two or more layers breaks a condition of symmetry around the symmetry plane causing a deviation in an optical response from the test structure.

2. The test structure according to claim 1 wherein said main pattern is formed by a stack of said two or more layers.

3. The test structure according to claim 1 wherein the test structure is adapted for use in performing any of overlay measurements, double-patterning, multi-patterning, Spacer Assisted Double Patterning (SADP), Self-Aligned Triple Patterning (SATP), and Litho-Etch-Litho-Etch (LELE) techniques.

4. The test structure according to claim 1 wherein the main pattern includes lines.

5. The test structure according to claim 1, wherein two vias are located at opposite sides of a line between said two spaced-apart auxiliary features and at opposite ends of said line.

6. The test structure according to claim 1 wherein the auxiliary pattern is in the form of a surface relief formed by features arranged in a spaced-apart relationship and being located within at least some of the features of the main pattern.

7. The test structure according to claim 6 wherein the surface relief features are any of grooves and vias.

8. The test structure according to claim 1, wherein data indicative of the optical response comprises a relation between first and second measured data pieces corresponding to first and second measurements taken at different measurement conditions.

9. The test structure according to claim 8, wherein said relation is a difference between the first and second measured data pieces.

10. The test structure according to claim 8, wherein said different measurement conditions are characterized by different polarizations of light collected from the test structure.

11. A method for use in metrology measurements of patterned samples, the method comprising: associating the patterned sample being measured with a corresponding test structure configured according to claim 1;

performing at least one measurement session on said test structure using a measurement plane parallel to the symmetry plane of the main pattern in the test structure, the measurement session comprising at least first and second measurements, each directing illuminating light onto said test structure along an illumination channel and collecting light reflected from said test structure propagating along a collection channel to be detected, such that detected light has a polarization state different from polarization of the illuminating light, and generating a measured data piece indicative of the light detected in the measurement, thereby generating at least first and second measured data pieces for said at least first and second measurements on the same test structure corresponding to the detected light having different first and second polarization states; and determining a relation between said at least first and second measured data pieces indicative of parameters of said main features in the main pattern.

* * * * *